United States Patent
Gleason et al.

(10) Patent No.: US 12,360,358 B2
(45) Date of Patent: Jul. 15, 2025

(54) MICRO-ELECTRO-MECHANICAL SYSTEM (MEMS) MICRO-MIRROR ARRAY (MMA) STEERED HIGH-POWER LASER TRANSMITTER

(71) Applicant: Raytheon Company, Arlington, VA (US)

(72) Inventors: Benn H. Gleason, Tucson, AZ (US); Gerald P. Uyeno, Tucson, AZ (US); Sean D. Keller, Tucson, AZ (US)

(73) Assignee: Raytheon Company, Arlington, VA (US)

( * ) Notice: Subject to any disclaimer, the term of this patent is extended or adjusted under 35 U.S.C. 154(b) by 979 days.

(21) Appl. No.: 17/238,147

(22) Filed: Apr. 22, 2021

(65) Prior Publication Data
US 2022/0342201 A1    Oct. 27, 2022

(51) Int. Cl.
G02B 26/08        (2006.01)
B81B 3/00         (2006.01)

(52) U.S. Cl.
CPC ........ G02B 26/0841 (2013.01); B81B 3/0048 (2013.01); B81B 3/0062 (2013.01); *B81B 2201/042* (2013.01)

(58) Field of Classification Search
CPC ............... B81B 3/0048; B81B 3/0062; B81B 2201/042; G02B 5/1819; G02B 5/3083; G02B 26/0833; G02B 26/0841; G02B 26/12; G02F 1/31
USPC .......... 359/199.2, 200.6, 216.1, 291, 484.06, 359/489.07, 613, 904
See application file for complete search history.

(56) References Cited

U.S. PATENT DOCUMENTS

| | | |
|---|---|---|
| 5,404,375 A | 4/1995 | Kroeger et al. |
| 5,854,702 A | 12/1998 | Ishikawa et al. |
| 6,181,450 B1 | 1/2001 | Dishman et al. |
| 6,271,953 B1 | 8/2001 | Dishman et al. |
| 6,327,063 B1 | 12/2001 | Rockwell |

(Continued)

FOREIGN PATENT DOCUMENTS

| | | | |
|---|---|---|---|
| CN | 102226848 A | * 10/2011 | |
| EP | 2333603 A1 | * 6/2011 | ......... G02B 26/0841 |
| WO | WO-2014200581 A2 | 12/2014 | |

OTHER PUBLICATIONS

English translation of Sun et al. (CN 102226848 A), from Google Patents.*

(Continued)

*Primary Examiner* — Stephone B Allen
*Assistant Examiner* — Daniel Jeffery Jordan
(74) *Attorney, Agent, or Firm* — Schwegman Lundberg & Woessner, P.A.

(57) ABSTRACT

A steerable laser transmitter pairs a MEMS MMA with an optical amplifier to provide a high-power steered laser beam over a wide FOR. A single MEMS MMA may be positioned downstream of the optical amplifier. In a two-stage architecture, a MEMS MMA provides continuous fine steer upstream of the optical amplifier and a beam steerer, another MEMS MMA or a QWP and stack of switchable PGs, provides discrete coarse steering downstream. In the two-stage architecture, the upstream MEMS MMA is configured to limit its steering range to the acceptance angle of the optical amplifier, at most ±2°×±2°. The MEMS MMA may include piston capability to shape the wavefront of the beam.

17 Claims, 7 Drawing Sheets

(56) References Cited

U.S. PATENT DOCUMENTS

| | | |
|---|---|---|
| 6,567,574 B1 | 5/2003 | Ma et al. |
| 6,792,028 B2 | 9/2004 | Cook et al. |
| 7,304,296 B2 | 12/2007 | Mills et al. |
| 7,593,641 B2 | 9/2009 | Tegge, Jr. |
| 7,626,152 B2 | 12/2009 | King et al. |
| 7,660,235 B2 | 2/2010 | Alicherry et al. |
| 7,969,558 B2 | 6/2011 | Hall |
| 8,301,027 B2 | 10/2012 | Shaw et al. |
| 8,305,578 B1 | 11/2012 | Mudge et al. |
| 8,311,372 B2 | 11/2012 | Anderson et al. |
| 8,368,889 B2 | 2/2013 | Schwiegerling et al. |
| 8,380,025 B2 | 2/2013 | Anderson et al. |
| 8,463,080 B1 | 6/2013 | Anderson et al. |
| 8,767,190 B2 | 7/2014 | Hall |
| 8,823,848 B2 | 9/2014 | Chipman et al. |
| 8,983,293 B2 | 3/2015 | Frankel et al. |
| 9,473,768 B2 | 10/2016 | Uyeno et al. |
| 9,477,135 B1* | 10/2016 | Uyeno .................. G02F 1/1326 |
| 9,632,166 B2 | 4/2017 | Trail et al. |
| 9,857,226 B2 | 1/2018 | LeMaster et al. |
| 9,904,081 B2 | 2/2018 | Uyeno et al. |
| 9,927,515 B2 | 3/2018 | Keller et al. |
| 10,148,056 B2 | 12/2018 | Uyeno et al. |
| 10,209,439 B2 | 2/2019 | Keller et al. |
| 10,243,654 B1 | 3/2019 | Uyeno et al. |
| 10,267,915 B2 | 4/2019 | Uyeno et al. |
| 10,381,701 B2 | 8/2019 | Motoi |
| 10,444,492 B2* | 10/2019 | Hopkins ............. F41H 13/0062 |
| 10,613,324 B2* | 4/2020 | Aoki .................... G02B 27/108 |
| 10,718,491 B1 | 7/2020 | Raring et al. |
| 10,969,598 B2 | 4/2021 | Fest et al. |
| 10,998,965 B2 | 5/2021 | Tong et al. |
| 11,042,025 B2 | 6/2021 | Uyeno et al. |
| 11,333,879 B2 | 5/2022 | Uyeno et al. |
| 2002/0141689 A1 | 10/2002 | Qian et al. |
| 2002/0196506 A1 | 12/2002 | Graves et al. |
| 2003/0062468 A1 | 4/2003 | Byren et al. |
| 2003/0081321 A1 | 5/2003 | Moon et al. |
| 2003/0185488 A1 | 10/2003 | Blumenthal |
| 2004/0072540 A1 | 4/2004 | Wilson et al. |
| 2004/0081466 A1 | 4/2004 | Walther et al. |
| 2004/0141752 A1 | 7/2004 | Shelton et al. |
| 2004/0258415 A1 | 12/2004 | Boone et al. |
| 2005/0031255 A1 | 2/2005 | Schroeder et al. |
| 2005/0100339 A1 | 5/2005 | Tegge |
| 2005/0122566 A1 | 6/2005 | Cicchiello |
| 2005/0288031 A1 | 12/2005 | Davis et al. |
| 2006/0038103 A1 | 2/2006 | Helmbrecht |
| 2007/0031157 A1 | 2/2007 | Yamada et al. |
| 2007/0036480 A1 | 2/2007 | Wu |
| 2007/0116405 A1* | 5/2007 | Kane .................... H04N 9/3129 |
| | | 348/E9.026 |
| 2008/0050064 A1 | 2/2008 | Sakai et al. |
| 2010/0054287 A1* | 3/2010 | Ghauri ................. B23K 26/352 |
| | | 372/29.014 |
| 2010/0149533 A1 | 6/2010 | Fest |
| 2010/0166430 A1 | 7/2010 | Alten |
| 2012/0002973 A1 | 1/2012 | Bruzzi et al. |
| 2012/0008133 A1 | 1/2012 | Silny et al. |
| 2012/0114337 A1 | 5/2012 | Aoki |
| 2012/0155885 A1 | 6/2012 | Hannah et al. |
| 2012/0168605 A1 | 7/2012 | Milanovic |
| 2013/0271818 A1 | 10/2013 | Bastien et al. |
| 2014/0063299 A1 | 3/2014 | Fest et al. |
| 2015/0099476 A1 | 4/2015 | Beals |
| 2015/0172218 A1 | 6/2015 | Beshai |
| 2015/0311981 A1 | 10/2015 | Inagaki et al. |
| 2015/0378242 A1 | 12/2015 | Auxier et al. |
| 2016/0003677 A1 | 1/2016 | Pezzaniti et al. |
| 2016/0043800 A1 | 2/2016 | Kingsbury et al. |
| 2016/0234703 A1 | 8/2016 | Aldana et al. |
| 2016/0266242 A1* | 9/2016 | Gilliland ............. G01S 7/4863 |
| 2016/0294472 A1 | 10/2016 | Palmer et al. |
| 2017/0293137 A1 | 10/2017 | Zhao et al. |
| 2018/0231715 A1* | 8/2018 | Bishop ................. G02B 26/085 |
| 2019/0066320 A1 | 2/2019 | Uyeno et al. |
| 2019/0154921 A1 | 5/2019 | Xing et al. |
| 2020/0244359 A1 | 7/2020 | Csonka et al. |
| 2021/0088776 A1 | 3/2021 | Uyeno et al. |
| 2021/0091854 A1 | 3/2021 | Uyeno et al. |
| 2021/0092260 A1 | 3/2021 | Uyeno et al. |
| 2021/0103056 A1* | 4/2021 | Braunreiter ............ H04N 23/56 |
| 2022/0350133 A1 | 11/2022 | Gleason et al. |

OTHER PUBLICATIONS

"MEMS Mirror Array—Beam Steering Mode", [Online]. Retrieved from the Internet: <www.youtube.com/watch?v=wHIUU3kKtzM>, (Aug. 10, 2017), 2 pgs.

Rodriguez, et al., "Beam steering by digital micro-mirror device for multi-beam and single-chip lidar", Proc. SPIE 10757, Optical Data Storage 2018: Industrial Optical Devices and Systems, (Sep. 14, 2018), 7 pgs.

Ryf, et al., "MEMS tip/tilt and piston mirror arrays as diffractive optical elements", Proc. SPIE 5894, Advanced Wavefront Control: Methods, Devices, and Applications III, (Aug. 30, 2005), 12 pgs.

Tsou, et al., "Extended-image spatial tracking technique for deep-space optical downlinks", Proc. SPIE 3762, Adaptive Optics Systems and Technology, (Sep. 27, 1999), 101-109.

Tuantranont, et al., "Optical beam steering using MEMS-controllable microlens array", Sensors and Actuators A: Physical vol. 91, Issue 3, (Jul. 15, 2001), 363-372.

"U.S. Appl. No. 17/007,917, Notice of Allowance mailed Jan. 10, 2022", 14 pgs.

"U.S. Appl. No. 17/007,917, Supplemental Notice of Allowability mailed Apr. 19, 2022", 2 pgs.

"U.S. Appl. No. 16/871,602, Non Final Office Action mailed Nov. 9, 2020", 18 pgs.

"U.S. Appl. No. 16/871,602, Notice of Allowance mailed Feb. 24, 2021", 5 pgs.

"U.S. Appl. No. 16/871,602, Response filed Feb. 8, 2021 to Non Final Office Action mailed Nov. 9, 2020", 12 pgs.

"U.S. Appl. No. 17/007,917, Non Final Office Action mailed Aug. 3, 2021", 35 pgs.

"U.S. Appl. No. 17/007,917, Response filed Dec. 1, 2021 to Non Final Office Action mailed Aug. 3, 2021", 16 pgs.

"High Contrast IR Wire Grid Polarizers", Edmund Optics, [Online]. Retrieved from the Internet: <URL: https://www.edmundoptics.com/f/high-contrast-ir-wire-grid-polarizers/14797/>, (Accessed Sep. 4, 2021), 1 pg.

"Mid-Wave Infrared (MWIR) and Long-Wave Infrared (LWIF) Waveplates", Edmund Optics, [Online]. Retrieved from the Internet: <URL: https://www.edmundoptics.com/f/mid-wave-infrared-mwir-and-long-wave-infrared-lwir-waveplates/14317/>, (Accessed Sep. 4, 2021), 2 pgs.

"Mirrorcle Technologies MEMS Mirrors—Technical Overview", Mirrorcle Technologies, Inc., (2018), 7 pgs.

Kim, et al., "Demonstration of large-angle nonmechanical laser beam steering based on LC polymer polarization grating", Proc. of SPIE vol. 8052 80520T, (May 13, 2011), 13 pgs.

Norton, Andrew, et al., "High-Power Visible-Laser Effect on a 37-Segment Iris AO Deformable Mirror", Proc. SPIE 7595, MEMS Adaptive Optics IV, 759506, (Feb. 17, 2010), 12 pgs.

Salmon, J.T., et al., "An Adaptive Optics System for Solid-State Laser Systems used in Inertial Confinement Fusion", First Annual International Conference on Solid-State Lasers for Application of Intertial Confinement Fusion, Monterey, California, May 30-Jun. 2, 1995, (Sep. 17, 1995), 13 pgs.

Wang, Jinxue, et al., "Doppler Winds Lidar Technology Development and Demonstration", AIAA-2005-6772, Space 2005, Long Beach, California, Aug. 30-1, 2005, 11 pgs.

Yamamoto, R., et al., "Evolution of a Solid State Laser", Proc. SPIE 6552, Laser Source Technology for Defense and Security III, 655205, (May 10, 2007), 11 pgs.

Ayral, J.-L., et al., "Phase-conjugate Nd:YAG laser with internal acousto-optic beam steering", Optics Letters, vol. 16, No. 16, (Aug. 15, 1991), 1225-1227.

(56) References Cited

OTHER PUBLICATIONS

Chiu, Yi, et al., "Shape-Optimized Electrooptic Beam Scanners: Analysis, Design, and Simulation", Journal of Lightwave Technology, vol. 17, No. 1, (Jan. 1999), 108-114.

Kim, Jihwan, et al., "Wide-angle, nonmechanical beam steering using thin liquid crystal polarization gratings", Proc. of SPIE, vol. 7093, (2008), 12 pgs.

* cited by examiner

MICRO-ELECTRO-MECHANICAL SYSTEM (MEMS) MICRO-MIRROR ARRAY (MMA) STEERED HIGH-POWER LASER TRANSMITTER

BACKGROUND OF THE INVENTION

Field of the Invention

This invention relates to laser transmitters, and more particularly to providing small, high-power laser transmitters that rapidly steer and point over a large field-of-regard (FOR).

Description of the Related Art

Laser transmitters traditionally used mechanically controlled mirrors, prisms, or refractive devices to aim, steer and scan laser beams over a FOR. Such mechanically controlled systems have disadvantages in size, weight, power consumption and cost ("SWaP-C") as well as failure rate and steering limitations.

A non-mechanical approach for beam steering is desirable since it is likely to be smaller, lighter, lower power and less expensive, better SWaP-C, as well as faster, more accurate, more reliable and provide more flexible steering. The challenge is to find a non-mechanical approach that maintains the FOR and range achieved by mechanically steered laser transmitters.

J. L. Ayral et. al. "Phase-conjugate Nd:YAG laser with internal acousto-optic beam steering" OPTICS LETTERS, Vol. 16, No. 16, pp. 1225-1227 Aug. 15, 1991 discloses a Nd:YAG oscillator that delivers a near-diffraction-limited beam that intercepts an acousto-optic deflector. The deflected beam is amplified in a high-gain Nd:YAG zigzag slab amplifier, reflected by an SBS phase-conjugate mirror and amplified again on the second pass. The deflected beam is extracted by reflection on a polarizing beam splitter, after 90° polarization rotation obtained by the double pass through a quarter-wave plate. The main features of this laser source are the following: First, the acoustic-optic deflector is placed on the low-energy beam and consequently does not suffer from any optical damage. Second, owing to the intrinsic properties of phase conjugation, the output beam direction is identical in magnitude to the one imposed by the deflector, independent of any internal reflection that occurs in the laser amplifier. Moreover, thermally induced phase distortions due to the double-pass amplifier are corrected. Third, the laser source is self-aligned.

Jihwan Kim et. al. "Wide-angle, nonmechanical beam steering using thin liquid crystal polarization gratings" Proc. Of SPIE Vol. 7093, 2008 discloses a two-stage technique of beam steering. A fine steering module is constructed of two Optical Phased Arrays (OPAs) designed to cover a ±3.125° range in both the horizontal and vertical directions and expands the steered beam by a factor of 2.5. A subsequent coarse-steering module is based on Liquid Crystal Polarization Grating (LCPGs) that exhibit wide-angle deflection, high overall transmittance, and a very thin package, which thus avoids problems with beam walkoff (loss of clear aperture arising from transverse shifts of the beam within the optical train). The fine and coarse steering modules provide continuous steering over a full 80°×80° FOR.

WO 2014/200581 "Non-Mechanical Beam Steering Tracking System" published Dec. 18, 2014 discloses one or more polarization gratings (PG) coupled to one or more Steerable Electro-Evanescent Optical Refractors (SEEOR) to provide the coarse steering advantage of the PG over a wide and also the continuous fine steering advantage of the SEEOR. Each SEEOR refractor does an excellent job of fine beam control within a narrower FOR (as much as 60°×15°). Vescent Photonics demonstrated a 50°×15° SEEOR. 6 PGs and a single SEEOR can be combined to provide precise fine pointing and a wide (120°×120° or more) FOR. This approach greatly reduces the total number of devices required, when compared to using either technology individually to cover the same FOR. Embodiments of a SEEOR are described in U.S. Pat. Nos. 8,463,080 and 8,311,372. Embodiments of a stack of PGs are described in J. Kim, C. Oh, M. J. Escuti, L. Hosting, and S. A. Serati, "Wide-angle, nonmechanical beam steering using thin liquid crystal polarization gratings," Proc. Of SPIE Vol. 7093, 2008. The terms SEEOR and LCWG are used synonymously in this invention.

This laser transmitter that can be rapidly steered over a large FOR. However, this transmitter cannot transmit at the long ranges required by some applications due to the power limitation of the LCWG. Insertion of an optical amplifier into the signal path may provide the requisite gain. However, the amplifier cannot be placed in front of the LCWG, which is already operating at its maximum power capability. Optical amplifiers provide uniform gain over a narrow acceptance angle (at most ±2°×±2°). As presently configured, the amplifier cannot be inserted down stream of the LCWG. The steering range is given as 30°×8° or 50°×15°), which is much larger than acceptance angle of the amplifier.

U.S. Pat. No. 9,477,135 entitled "Non-Mechanically Steered High-Power Laser Transmitter" overcomes this limitation by placing an optical amplifier between a LCWG that provides continuous fine steering and a PG stack that provides discrete coarse steering. The two-dimensional steering range of the LCWG is limited to the acceptance angle of the optical amplifier (<=±2°×±2°). The amplifier should provide at least 10 dB gain with at most a 3 dB variation over the acceptance angle with an electrical to optical efficiency of at least 0.5%. This performance is unobtainable over wide steering ranges. The transmitter achieves higher steering precision and greater speed e.g., at least 1° per micro second by limiting the steering range of the LCWG. To achieve the equivalent FOR, the number of polarization gratings in the stack must be increased, which increases cost (gratings and drive electronics). The number of PGs in the stack is selected to cover a wide FOR, at least 10°×10°, preferably at least 30°×30° and greater than 120°×120° in each axis.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention pairs a Micro-Electro-Mechanical System (MEMS) Micro-Mirror Array (MMA) with an optical amplifier to provide a steered high-power, wide FOR laser transmitter capable of continuous fine steering and pointing.

In an embodiment, an optical amplifier is placed between a first MEMS MMA that provides continuous fine steering and a beam steerer that provides discrete coarse steering over the wide FOR. The two-dimensional steering range of the first MEMS MMA is limited to the acceptance angle of the optical amplifier ($<=\pm2°\times\pm2°$) over which the amplifier provides approximately uniform gain. The beam steerer is configured to cover a wide FOR, at least 10°×10°, preferably at least 30°×30° and greater than 120°×120° in each axis. In one configuration, the beam steerer includes a fixed QWP that converts a linearly polarized and amplified light beam to a circularly polarized and amplified light beam and a stack of switchable PGs responsive to command signals to discretely steer the circularly polarized and amplified light beam in the coarse angular range. A linear polarizer is suitably incorporated with the laser system but may be positioned anywhere upstream of the fixed QWP. In another configuration, the beam steerer includes a second MEMS MMA that is responsive to command signals to discretely steer the amplified beam in the coarse angular range.

In another embodiment, a single MEMS MMA is positioned downstream of the optical amplifier to continuously steer the amplified light beam over the wide FOR.

In different embodiments, the MEMS MMA can support a diversity of wavelengths of light without changes to the material system or command signals (steering parameters) by proper configuration of reflective coatings applied to the mirrors. The wavelengths may span the UV, Visible and IR bands. In one case, the mirrors may all have a broadband reflective coating in which case the spectral content of the amplified light beam is determined by the spectral output of the laser. In another case, the mirrors may all have a narrowband reflective coating at a particular wavelength. Changing this wavelength does not affect either the material system or steering parameters for the MEMS MMA. In yet another case, the mirrors may have narrowband reflective coatings at different wavelengths such that the amplified light beam includes a diversity of wavelengths.

In different embodiments, the MEMS MMA may be partitioned into a plurality of segments, each segment including a plurality of mirrors. Each segment of mirrors is responsive to command signals to tip and tilt to form and steer a light beam such that in combination the MEMS MMA steers a plurality of different light beams. These beams may have the same or different spectral content.

In an embodiment, the mirrors of the MEMS MMA may tip, tilt and piston in 3 DOF. The additional piston capability can be used to perform one or more of the following functions including but not limited to focusing or collimating the light beam, adjusting a size, divergence or intensity profile of the light beam, producing deviations in the wavefront of the light beam to compensate for atmospheric distortion and adjusting the phase to maintain a zero phase difference across the wavefront of the light beam These and other features and advantages of the invention will be apparent to those skilled in the art from the following detailed description of preferred embodiments, taken together with the accompanying drawings, in which:

BRIEF DESCRIPTION OF THE DRAWINGS

FIG. 2 is a diagram illustrating the continuous fine steering of the first-stage and the discrete coarse steering of the second-stage over a wide FOR;

FIG. 7 is an embodiment of a single stage laser transmitter in which a MEMS MMA is positioned downstream of the optical amplifier to provide continuous fine steering over the wide FOR;

DETAILED DESCRIPTION OF THE INVENTION

The two-stage approach, comprising a non-mechanical beamsteerer such as a LCWG for continuous fine tuning over a 30°×8° or 50°×15° angular range, an optical amplifier and a switchable PG stack for discrete coarse tuning over an angular range of 120°×120° or more (U.S. Pat. No. 9,477,135) provides a high power laser transmitter that can be rapidly steered over a large FOR.

Non-mechanical beamsteering allows a significant reduction in the size, weight and power of the system, as only a small fraction of the FOR is illuminated at any instant in time. This reduces the required input power to the laser source, the size of the system, and removes the need for equipment that dissipates waste heat. However, the non-mechanical beamsteering waveguide and particularly the LCWG has been found to have a number of limitations, which may include, but are not limited to, steering a very narrow band of wavelengths about a center wavelength. Furthermore each material system e.g., substrates, coatings and liquid crystals, and voltage settings to steer the laser beam are unique to each center wavelength. Therefore to accommodate different wavelengths requires different LCWG devices and significant investment in materials, manufacturing, set-up and calibration etc. to design and field each device. The LCWG cannot manipulate the wavefront of the beam to, for example, focus the beam into a spot, to provide wavefront correction e.g. atmospheric distortion, or to compensate for path length differences across the beam. The LCWG can steer one and only one beam at the single wavelength. The LCWG cannot steer multiple beams of the same or different wavelengths. The LCWG is limited to receive the optical energy from a single optical source, it cannot combine the optical energy from multiple sources and focus that energy into a single focused optical beam to provide the active illumination. Furthermore, the LCWG must be positioned upstream (or before) the optical amplifier as the amplified light beam would far exceed the saturated power level of a LCWG.

Accordingly, various aspects and embodiments discussed herein provide an optical system configured to amplify and steer a high-power laser beam with the capability to manipulate the wavefront of the beam, to segment the beam into a plurality of independently steerable beams of the same or different wavelengths, while maintaining a reduced weight, size, and power consumption when compared to typical imaging systems. Various other advantages and benefits of the active imaging system and methods described herein are discussed below with reference to FIGS. 1-9.

Our solution is to pair a Micro-Electro-Mechanical System (MEMS) Micro-Mirror Array (MMA) with an optical amplifier to provide a steered high-power, wide FOR laser transmitter capable of continuous fine steering and pointing without the spectral or other limitations of the LCWG. In a two-stage architecture, a first MEMS MMA upstream of the optical amplifier provides continuous fine steering and a beam steerer (e.g., either a second MEMS MMA or a SQP and stack of switchable PGs) down stream of the optical amplifier provides discrete coarse steering over a wide FOR. In a one-stage architecture, a MEMS MMA is placed downstream of the optical amplifier to provide continuous steering over the wide FOR. The MEMS MMA is capable of faster steering than the LCWG.

In an embodiment, the laser is configured to produce a light beam at a wavelength of 1.55 microns. The amplifier is Erbium (Er) doped to provide optical amplification of the 1.55 micron beam. Er:YAG, Er:Glass or similar amplifier configurations may be used. For different wavelengths, the reflective coatings on the mirrors can be formed to reflect the appropriate band and the amplifier can be doped with different dopants to provide gain.

Figure 1:
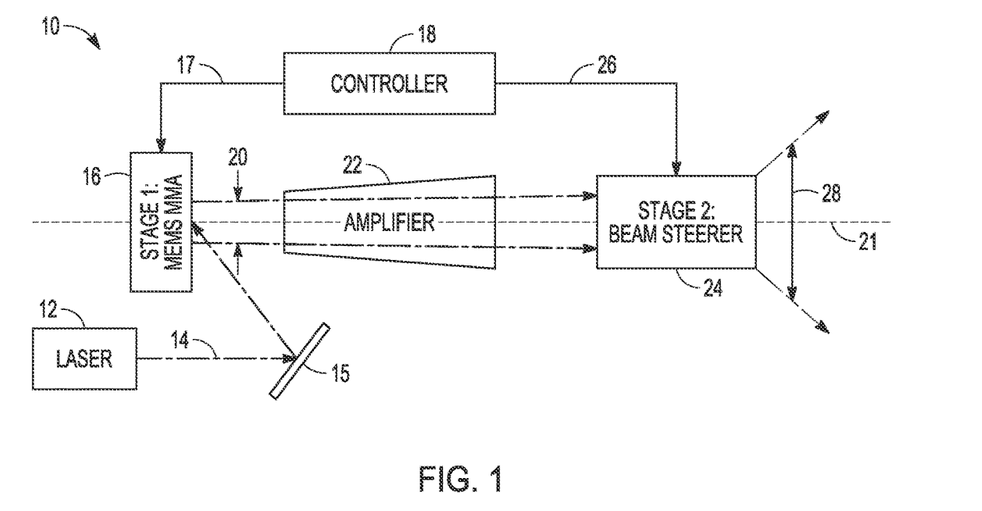
FIG. 1 is a block diagram of an embodiment of a two-stage MEMS MMA steered high-power laser transmitter.

Referring now to FIG. 1, in an embodiment of a two-stage architecture, a steerable laser transmitter 10 comprises a laser 12 configured to produce a light beam 14, an optional fold mirror 15, a first stage MEMS MMA 16 responsive to command signals 17 issued by a controller 18 to continuously steer the light-beam over a fine two-dimensional angular range 20 of no greater than ±2°×±2° and an optical amplifier 22 oriented along an optical axis 21 that provides substantially uniform gain over the angular range 20 (determined by the amplifier's acceptance angle). A second stage beam steerer 24, suitably positioned at the output of the amplifier, responsive to command signals 26 issued by controller 18 discretely steers the amplified light beam 14 over a coarse two-dimensional angular range 28 (greater than the amplifier's acceptance angle) of at least ±10°×±10° over a wide FOR.

Figure 2:
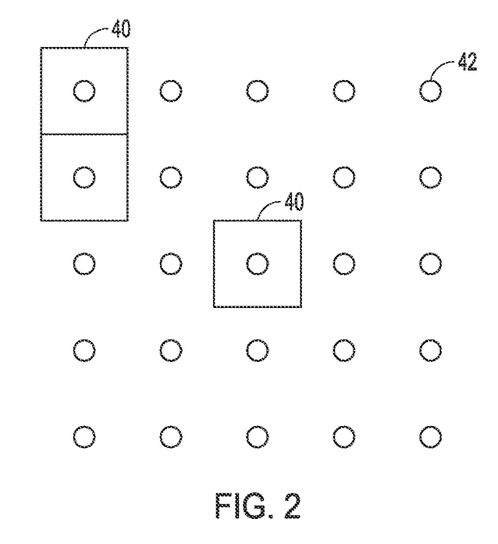

Referring now to FIG. 2, box 40 represents the steering of the light beam by the first stage MEMS MMA over the fine two-dimensional angular range 20 (<=±2°×±2°). Each dot 42 represents the centroid of discrete coarse steering over the coarse two-dimensional steering range 29 by the second stage beam steerer. To maintain continuous steering over the wide FOR, the spacing of the dots is equal to the fine angular range. The collection of dots defines the coarse angular range. The total FOR is defined by the combination of the MEMS MMA and beam steerer.

Figure 3A:
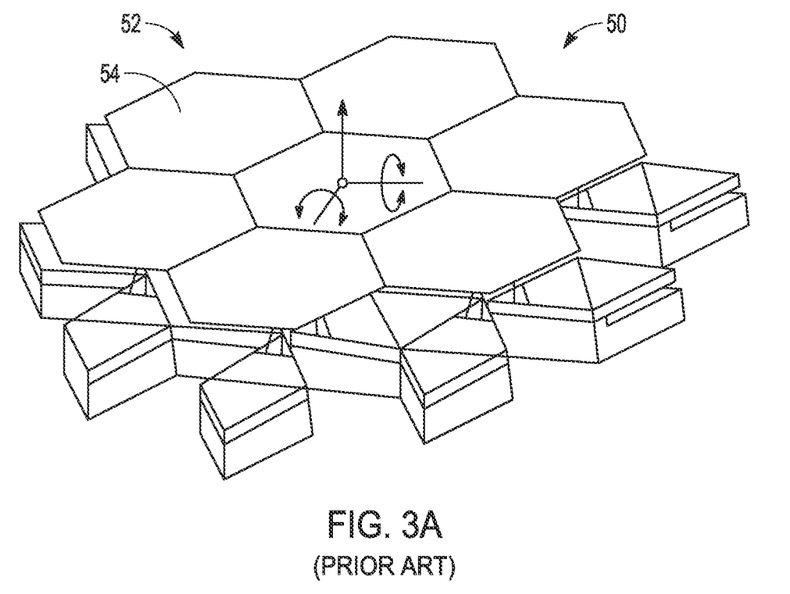
FIGS. 3A-3B are illustrations of a known embodiment of a Tip/Tilt/Piston ("TTP") MEMS MMA and a single mirror actuated to tip, tilt and piston.
Figure 3B:
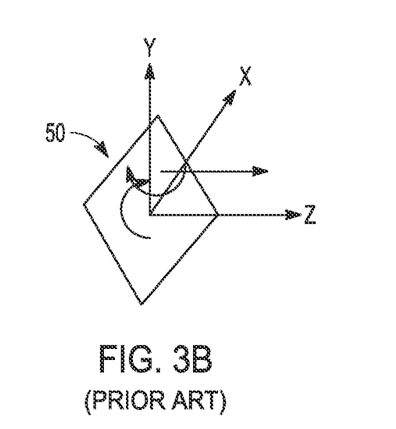

As best shown in FIGS. 3A-3B, a Micro-Electro-Mechanical System (MEMS) Micro-Mirror Array (MMA) 50 comprises a plurality of independently and continuously controllable mirrors 52 to re-direct optical radiation to focus and steer the optical beam(s). Each mirror is capable of at least "Tip" (rotation about an X-axis), "Tilt" (rotation about a Y-axis and "Piston" (translation along a Z-axis, perpendicular to the XY plane) where the X, Y and Z are orthogonal axes in a three-dimensional space. The Piston capability can be used generically speaking to "shape" the beam(s) that are reflected off of the MEMS MMA.

The MEMS MMA can support a diversity of wavelengths of light without changes to the material system or command signals (steering parameters) by proper configuration of reflective coatings 54 applied to the mirrors. The wavelengths may span the UV, Visible and IR bands. In one case, the mirrors may all have a broadband reflective coating in which case the spectral content of the amplified light beam is determined by the spectral output of the laser. In another case, case, the mirrors may all have a narrowband reflective coating at a particular wavelength. Changing this wavelength does not affect either the material system or steering parameters for the MEMS MMA. In yet another case, the mirrors may have narrowband reflective coatings at different wavelengths such that the amplified light beam includes a diversity of wavelengths.

The MEMS MMA can be partitioned into a plurality of segments, each including a plurality of mirrors to form and steer different light beams, adjust the size/power of a given light beam, and to combine multiple laser sources.

With a plurality of mirrors, the piston capability can be used to perform beam shaping functions such as to adjust the focus, collimation, size, divergence or intensity profile of the light beam, produce deviations in the wavefront of the light beam beam to compensate for atmospheric distortions, adjust phase to maintain a zero phase difference across the wavefront of the light beam, or to improve the formation and steering of the light beam by approximating a continuous surface across the micro-mirrors.

The MEMS MMA is preferably capable of tipping and tilting over range of at least −15°×+150 to steer over a range of +/−30°×30° and pistoning (translating) over a range of at least +/−15 microns (at least one-half wavelength in either direction) at a rate of at least 1 KHz (<1 millisecond). Piston is not required for basic steering of the light beam but allows for shaping of the beam. The MEMS MMA must have a sufficient number of mirrors, mirror size/resolution, fill factor, range of motion, response time, response accuracy and uniformity across the array.

One such MEMS MMA is described in U.S. Pat. No. 10,444,492 entitled "Flexure-Based, Tip-Tilt-Piston Actuation Micro-Array", which is hereby incorporated by reference. As shown in FIGS. 1-3 of the '492 patent this MEMS MMA uses flexures to support each mirror at three fulcrum points (or vertices) of an equilateral triangle. The three different pairs of fulcrum points define three axes at 60 degrees to one another in the XY plane. Each mirror pivots about each axis to produce tip, tilt and piston in the XYZ space. This MEMS MMA is currently being commercialized by Bright Silicon technologies for "digitally controlling light."

Figure 4:
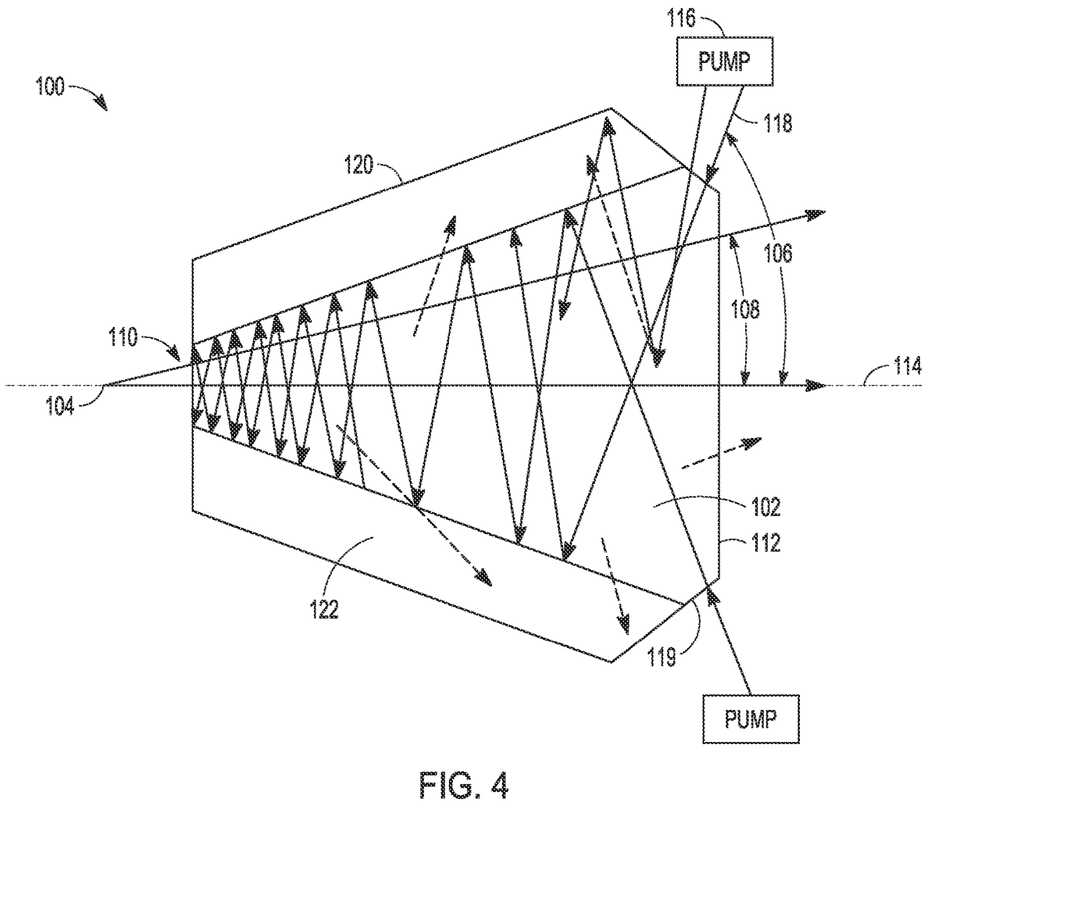
FIG. 4 is a diagram of an embodiment of an optical amplifier.

Referring now to FIG. 4, in an embodiment an optical amplifier 100 comprises a crystal 102 that is doped to amplify a laser beam 104 and tapered such that the amplifier's acceptance angle 106 approximately matches the fine two-dimensional angular range 108 of the first stage MEMS MMA. The crystal has a conical shape with both the entrance and larger exit faces 110 and 112, respectively, perpendicular to the optical axis 114. Alternately, exit face 112 could be tilted to provide anamorphic compression of the in-plane component of the beam to make the exit beam circular. One or more pump lasers 116 inject a pump beam 118 in a zig-zag approach from chamfered sections 119 of exit face 112 inwards. The entrance and exit faces are tapered to allow pump beam propagation through the amplifier without the structure of the pump lasers interfering with the steered laser beam 104. If the acceptance angle is too large, >±2°×±2°, the uniformity of optical gain and the efficiency of the amplifier will degrade. In an embodiment, the amplifier provides an optical gain of at least 10 dB with a uniformity of better than 3 dB and an efficiency of at least 0.5% over its acceptance angle.

Additionally, the amplifier surface is coated (or clad) 120 to reduce the effects of amplified spontaneous emission (ASE) 122 while confining the pump beam 118 inside the amplifier. The rotational symmetry of the conical amplifier reduces the effects of corner stresses when mounting the amplifier. Minimizing the depolarization helps maintain the overall transmitter efficiency. In this amplifier the gain is proportional to the length of the amplifier, which does not have a zig-zag propagation pattern.

Figure 5:
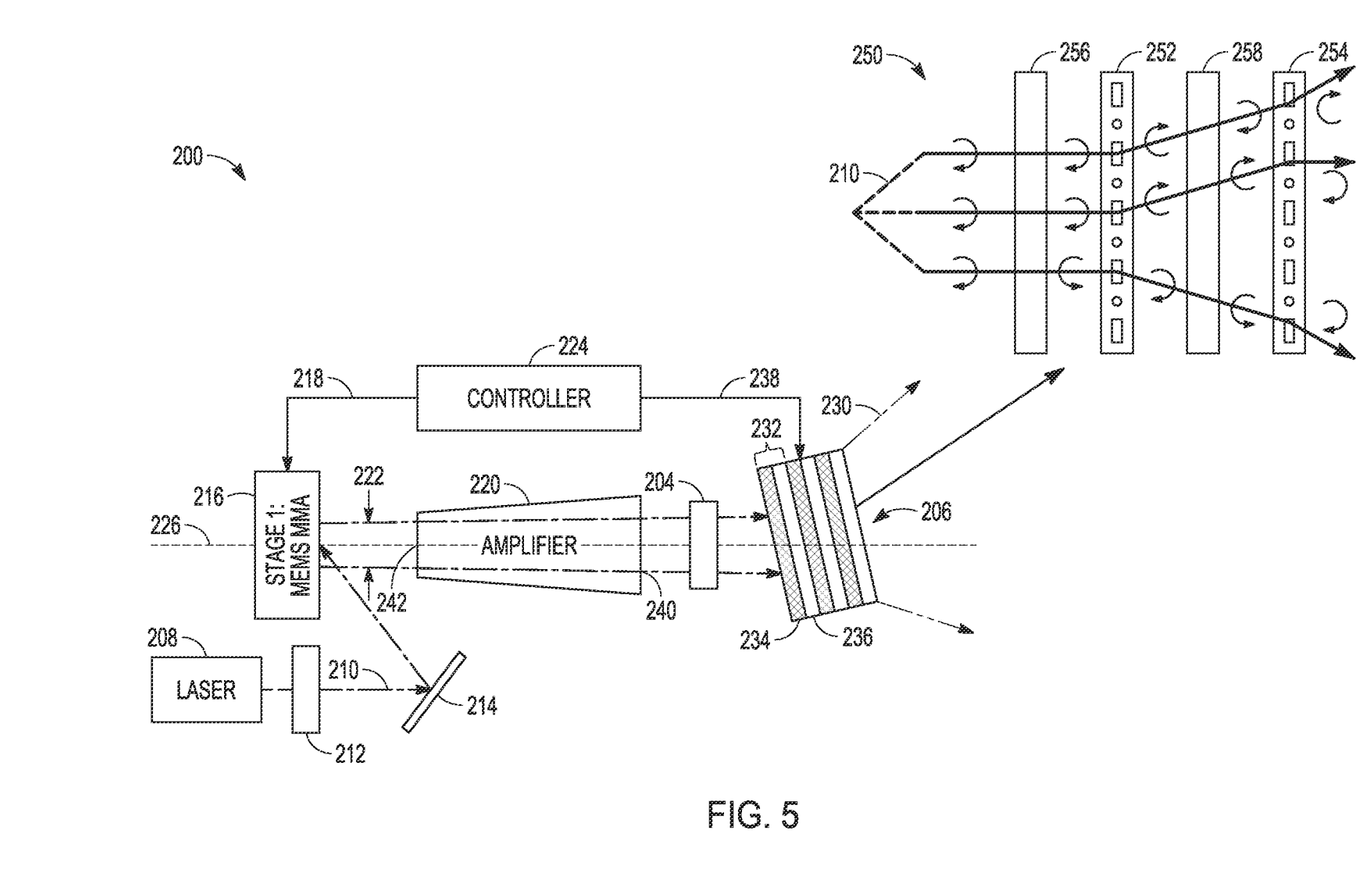
FIG. 5 is a diagram of the two-stage laser transmitter in which the first stage is a MEMS MMA capable of continuous fine steering and the second stage is a quarter-wave plate (QWP) and stack of switchable polarization gratings (PGs) capable of discrete coarse steering.

Referring now to FIG. 5, in an embodiment of a steerable laser transmitter 200 a second stage beam steerer 202 includes a QWP 204 and a stack of switchable PGs 206. A laser 208 is configured to emit a light beam 210. A linear polarizer (LP) 212 such as a piece of glass at a specific angle e.g. a "Brewster Window" linearly polarizes the light beam 210. This is suitably positioned at the output of the laser but could potentially positioned anywhere upstream of the QWP 204.

Light beam 210 is suitably re-directed off of fold mirror 214 to a first stage MEMS MMA 216 responsive to command signals 218 issued by a controller 220 to continuously steer the light-beam over a fine two-dimensional angular range 222 of no greater than ±2°×±2°. An optical amplifier 224 oriented along an optical axis 226 amplifies light beam 210. The optical amplifier provides substantially uniform gain over the fine angular range 222 (determined by the amplifier's acceptance angle).

The fixed quarter waveplate (QWP) 204, suitably positioned at the output of the amplifier, converts the linear polarization of light beam 210 to a circular polarization. The QWP is suitably zero-order to reduce angular dependence and provide uniform retardance over the narrow steering range of the MEMS MMA. The switchable polarization grating (PG) stack 206 provides discrete steering over a coarse angular range 230 (greater than the amplifier's acceptance angle). The stack 206 comprises a plurality of polarization gratings (PGs) 232, each comprising an electrically controlled half waveplate (HWP) 234 and a grating 236 (passive or active). Application of voltage 238 to the electrically controlled HWP 235 turns the circular polarization of light beam 210 into either right-hand or left-hand polarization. The PG 232 deflects the different handedness into different exit angles. By controllably selecting the handedness one may controllably select the angular deflection.

In the depicted embodiment, an exit face 240 of the crystal is tilted with respect to an entrance face 242, which is perpendicular to the optical axis 226, to provide anamorphic compression to the elliptical portion of the in-plane beam to make the exit beam circular again. The PG stack 206 is tilted to match the tilt of the exit face. In another embodiment, the exit face is parallel to the entrance face and the exit beam is elliptical. The elliptical shape beam provides higher spatial resolution in-plane than the circular beam.

In certain systems, it may be useful for the output beam to have a fixed polarization. This requires a final HWP. In addition, it is usually desirable to have the output beam be linearly polarized. This requires adding a final fixed, and in this case zero-order, QWP.

Jihwan Kim et. al. section 3 "Single LCPG Steering Stage" and section 4 "Coarse Steerer Design Option" describes active and passive PG stages that can be cascaded to form a PG stack that provides discrete coarse steering over a wide FOR. A "stage" may comprise a switchable LC half waveplate and an active PG or a pair of switchable LC half waveplates and a pair of passive PGs. Liquid crystal polarization gratings can function as highly efficient beam steering elements, by deflecting all of the incident light into one of three diffraction orders. The incident laser beam must be circularly polarized.

Although it is known in the art that PGs operate in sine space, their contribution to the total angular FOR can be described to a first order using angles only. This invention does not claim any modifications to PGs and therefore doesn't need to precisely describe the PG according to their native sine space. Therefore two PGs of 8° and 6° deviation are referred to as having a 24° deviation, when the physical deviation is actually the sine of 8° plus the sine of 16°, or 24.5°.

In an active stage, when no voltage is applied, the LC half waveplate switches the handedness of the incident laser beam with a specific amplitude of external applied voltage. Without a specific amplitude of external applied voltage, it allows the incident laser beam to pass through without changing its polarization state. The LCPG diffracts RCP and LCP beams into the +1 and −1 orders respectively, with approximately 100% efficiency. The polarization sensitive diffraction of LCPGs can be used to select the steering direction into one of the first orders, by simply switching the LC half waveplate. The active LCPG can steer all of the incident laser beam into the zero-order under an applied voltage to provide three unique steering directions corresponding to the three diffraction orders.

Referring now to the inset portion of FIG. 5, a passive stage 250 includes two passive PGs 252, 254 and two variable LC half waveplates 256, 258 to essentially perform in the same manner as the active PG steering stage to steer the incident beam 210 to three different directions. The steering directions are determined by the voltage-states of the two LC half waveplates 256, 258, positioned in front of the two passive PGs. When both the waveplates are in the same state, the diffraction from the first PG is compensated by the second PG. When the waveplates are in opposite states, the incident laser beam can be diffracted into the positive or negative order.

A number of PG stages (active or passive) may be cascaded to provide discrete coarse steering. The diffraction angle of the first stage determines the resolution of the coarse steering.

In an embodiment, the amplifier has an acceptance angle of ±0.5° both in-plane and out-of-plane. The MEMS MMA provides continuous steering over the amplifier's acceptance angle of ±0.5°. A binary stack has 4 polarization gratings (where each PG is an active or passive stage) per axis (total of 8) with discrete states of ±0.5, ±1.0, ±2.0 and ±4.0. The first PG has the same steering range as the MEMS MMA for the transmitter to project a beam at 0°. For a MEMS MMA with a range of ±0.5° the first grating would be ±0.5°. Setting the grating at +0.5° supports projecting the beam from 0 to 1°. Setting the grating at −0.5° supports projecting the beam from −1° to 0°. To steer 8°, the waveguide would be +0.5°, the first grating would be 0.5°, the second grating would be 1.0°, the third grating 2.0°, and the fourth grating 4.0° (0.5+0.5+1.0+2.0+4.0=8). The transmitter is capable of steering a high-power spot beam over a FOR of +8° with a resolution limited by the MEMS MMA. In one embodiment, the MEMS MMA steering provides steering resolution of approximately 17 micro radians.

In another embodiment, the amplifier has an acceptance angle of ±2.0° both in-plane and out-of-plane. The MEMS MMA provides continuous steering over ±2.0°. A binary stack has 4 polarization gratings per axis (total of 8) with discrete states of ±2.0°, ±4.0°, ±8.0° and ±16.0. The first PG needs to have the same steering as the MEMS MMA for the configuration to project a beam at 0°. For a MEMS MMA with a range of ±2.0° the first grating would be +2.0. Setting the grating at +2.0° supports projecting the beam from 0 to 4°. Setting the grating at −2.0° supports projecting the beam from −4° to 0°). To steer 30°, the waveguide would be +2.0°, the first grating would be 2.0°, the second grating would be 4.0, the third grating 8.0, the fourth grating 16.0 (2.0+2.0+4.0+8.0+16.0=32). The transmitter is capable of steering a high-power spot beam over a FOR of ±32° with a resolution of approximately 17 micro radians.

In another embodiment, the amplifier acceptance angles are not equal, ±2.0° in-plane and ±1.0° out-of-plane. The MEMS MMA provides continuous steering over ±2.0° in-plane and 1.0° out-of-plane. A stack has 4 polarization gratings in the in-plane axis with discrete states of 2.0°, ±4.0°, ±8.0° and ±16.0° and 5 polarization gratings in the out-of-plane axis with discrete states of ±1.0°, ±2.0°, ±4.0°, ±8.0° and ±16.0° for a total of 9. The first PG in each axis needs to have the same steering as the MEMS MMA for the configuration to project a beam at 0°. The transmitter is capable of steering a high-power spot beam over a FOR of ±32° with a resolution of approximately 17 micro radians.

Figure 6:
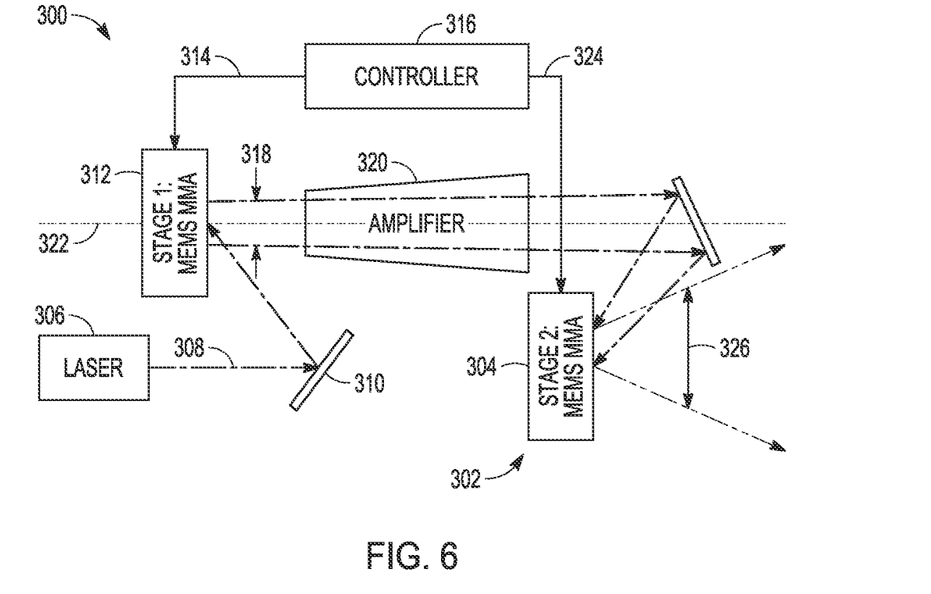
FIG. 6 is a diagram of the two-stage laser transmitter in which the first stage is a first MEMS MMA capable of continuous fine steering and the second stage is a second MEMS MMA capable of discrete coarse steering.

Referring now to FIG. 6, in an embodiment of a steerable laser transmitter 300 a second stage beam steerer 302 includes a second MEMS MMA 304. A laser 306 is configured to emit a light beam 308. An optional fold mirror 310 re-directs light beam 308 to a first stage MEMS MMA 312 responsive to command signals 314 issued by a controller 316 to continuously steer the light-beam over a fine two-dimensional angular range 318 of no greater than ±2°×±2°. An optical amplifier 320 oriented along an optical axis 322 provides substantially uniform gain over the angular range 318 (determined by the amplifier's acceptance angle). The second MEMS MMA 304, suitably positioned at the output of the amplifier, responsive to command signals 324 issued by controller 316 discretely steers the amplified light beam 308 over a coarse two-dimensional angular range 326 (greater than the amplifier's acceptance angle) of at least ±10°×±10° over a wide FOR. Unlike the LCWG, the MEMS MMA can be positioned downstream of the optical amplifier as its power saturations levels are much higher. Cascading a pair of MEMS MMAs on either side of the optical amplifier also allows for faster steering speeds. The first stage MEMS MMA 312 only steers over the fine angular range so steering speeds can be increased. Although the second state MEMS MMA 304 must discretely steer over the coarse steering range, the rate of updates is less, hence the effective steering speed can be increased.

Figure 7:
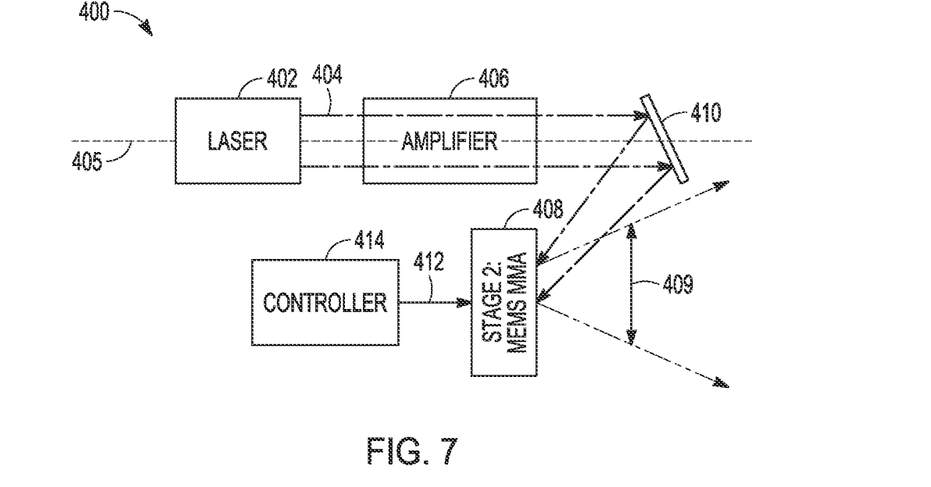

Referring now to FIG. 7, an embodiment of a steerable laser transmitter 400 includes a laser 402 that emits a light beam 404, an optical amplifier 406 oriented along an optical axis 405 that amplifies the light beam 404 and a MEMS MMA 408 positioned downstream of the optical amplifier to continuously steer the amplified light beam 404 over a wide FOR 409. Because of its much higher power saturation levels, fast steering and steering range, the MEMS MMA can handle the amplified power levels and provide all of the continuous steering over the FOR. The effective steering speeds may be slower than the cascaded MEMS MMA but only a single device is required. In this embodiment, an optional fold mirror 410 directs the amplified light beam onto the MEMS MMA 408, which is responsive to command signals 412 from a controller 414 to tip and tilt the mirrors to steer the amplified light beam.

Figure 8A:
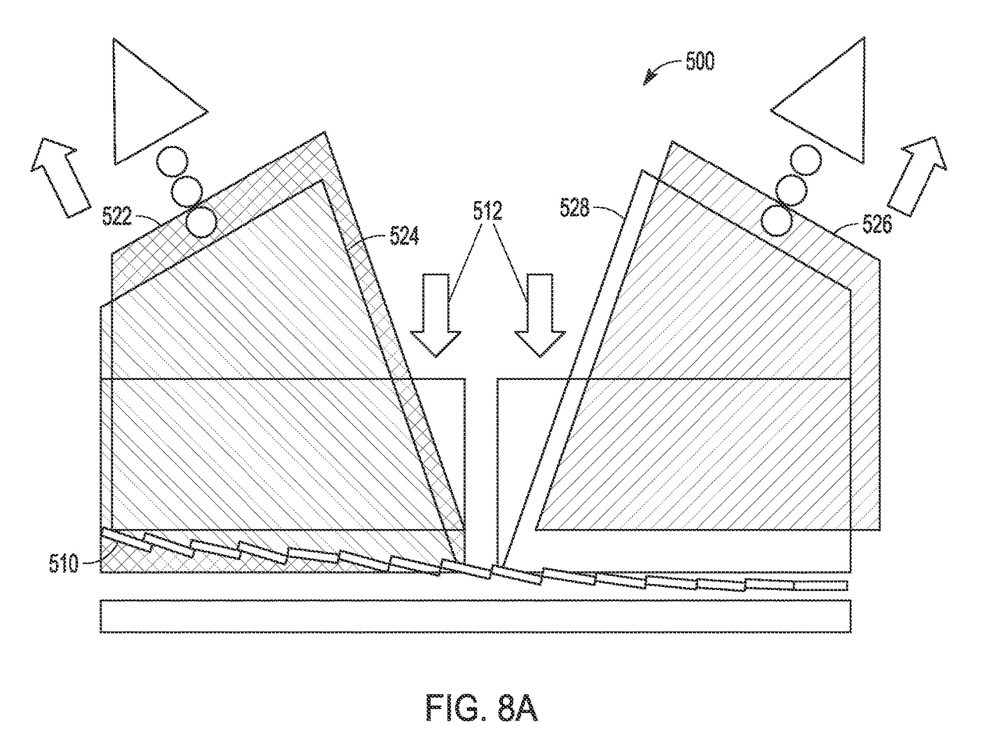
FIGS. 8A and 8B are embodiments in which the MEMS MMA is partitioned into multiple segments to steer multiple amplified spot beams and in which the mirrors reflect different wavelengths such that the one or more amplified spot beams include multiple different wavelengths.
Figure 8B:
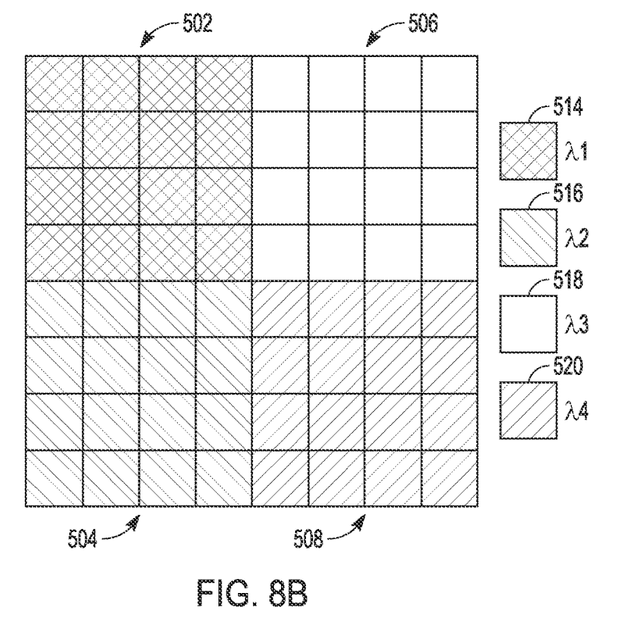

As illustrated in FIGS. 8A-8C, responsive to command signals from the controller, a MEMS MMA 500 is partitioned into four segments 502, 504, 506 and 508 each including a plurality of mirrors 510 illuminated by a light beam 512. The mirrors in the different sections are provided with reflective coatings 514, 516, 518 and 520 at different wavelengths. In response to command signals, the MEMS MMA tips and tilts the mirrors 510 in each segment to independently form and steer optical beams 522, 524, 526 and 528 over the fine and/or coarse angular ranges in the wide FOR. The MEMS MMA may be configured to form a single beam including the diversity of spectral components.

Figure 9:
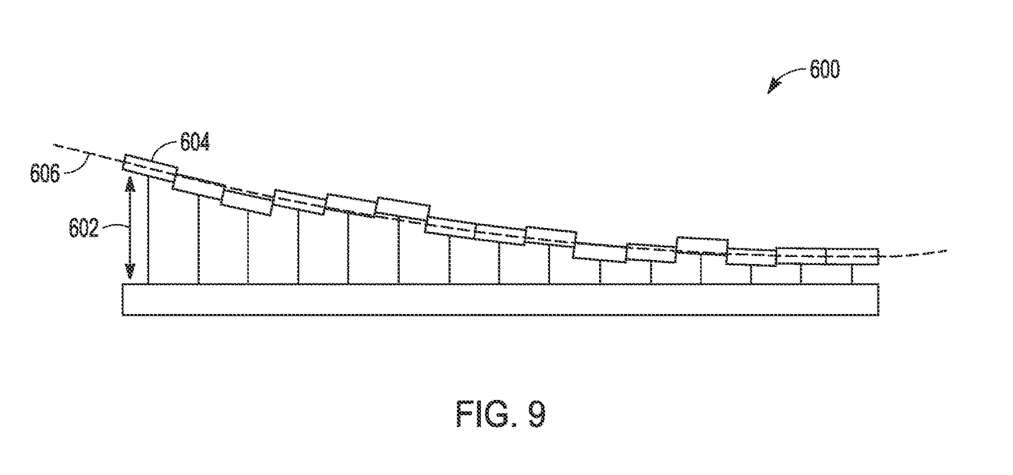
FIG. 9 is an illustration of using the piston capability of the mirrors to shape the light beam.

As previously mentioned, the MMA's piston capability can be generally used to "shape" the light beam (or amplified light beam). As illustrated in FIG. 9, responsive to command signals a MEMS MMA 600 can adjust the piston 602 of mirrors 604 to induce deviations from a base curvature 606. This can be done to compensate for path length variation of the light beam (to maintain zero phase across the beam), to correct for atmospheric distortion or both. Adjustments for path length variation can be calibrated offline and stored in a lookup table (LUT) as a function of scan angle. Adjustments for atmospheric distortion are done in real-time during operation of the active imaging system. For wavefront correction, a source emits optical energy in a similar band to illumination e.g., SWIR a beam steerer scans the optical beam onto scene. A wavefront sensor measures the wavefront of the reflected beam to determine the effects of atmospheric distortion. A controller computes the requisite piston adjustments required to correct the wavefront and provides them as command signals to the MEMS MMA. In high quality, high performing active imaging systems, the ability to accurately remove the effects of path length variation and atmospheric distortion is critical to achieving useful imagery of the scene, and important features identified within the scene. Piston may also be used to adjust the focus, size, divergence or intensity profile of the light beam.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A steered high-power laser transmitter comprising:
   a laser system configured to emit a light beam;
   a discrete optical amplifier oriented along an optical axis to amplify the light beam, wherein the discrete optical amplifier provides substantially uniform gain over a fine angular range no greater than ±2°×±2° about the optical axis;
   a first Micro-Electro-Mechanical System (MEMS) Micro-Mirror Array (MMA) including a plurality of mirrors responsive to command signals to tip and tilt in two degrees-of-freedom (2 DOF) to steer the light beam, wherein said first MEMS MMA is positioned upstream of the discrete optical amplifier to steer the light beam over only the fine angular range, and
   a beam steerer positioned downstream of the optical amplifier to discretely steer the light beam in a coarse angular range of at least ±10°×±10°.

2. The steered high-power laser transmitter of claim 1, wherein the optical amplifier provides at least 10 dB optical gain with a uniformity of better than 3 dB over the fine angular range with an electrical-to-optical efficiency of at least 0.5%.

3. The steered high-power laser transmitter of claim 1, wherein the optical amplifier comprises a crystal having a rotationally symmetric conical taper about the optical axis from an entrance face to a larger exit face, wherein an angle of taper from the entrance face to the larger exit face defines an acceptance angle of the amplifier that constrains the fine angular range.

4. The steered high-power laser transmitter of claim 1, further comprising:
a linear polarizer configured to convert the light beam to linear polarized light;
wherein the beam steerer comprises:
a fixed quarter waveplate that converts the linearly polarized and amplified light beam to a circularly polarized and amplified light beam; and
a stack of switchable polarization gratings (PGs) responsive to command signals to discretely steer the circularly polarized and amplified light beam in the coarse angular range.

5. The steered high-power laser transmitter of claim 1, wherein the beam steerer comprises a second MEMS MMA including a plurality of mirrors responsive to command signals to tip and tilt in two degrees-of-freedom (2 DOF) to discretely steer the light beam in the coarse angular range.

6. The steered high-power laser transmitter of claim 1, wherein the first MEMS MMA is partitioned into a plurality of segments to form a plurality of light beams from the light beam, each segment including a plurality of mirrors, and is responsive to command signals to tip and tilt the mirrors in each segment to independently steer a plurality of different light beams.

7. The steered high-power laser transmitter of claim 1, wherein the mirrors are provided with coatings that reflect light at different wavelengths such that the amplified light beam includes a plurality of different wavelengths.

8. The steered high-power laser transmitter of claim 1, wherein the first MEMS MMA includes a plurality of mirrors configured to tip, tilt and piston in 3 DOF to shape the light beam.

9. The steered high-power laser transmitter of claim 8, wherein said mirrors tip, tilt and piston to shape the light beam to perform one or more of the following:
focus or collimate the light beam;
adjust a size, divergence or intensity profile of the light beam;
produce deviations in a wavefront of the light beam to compensate for atmospheric distortion; and
adjust a phase and maintain a zero phase difference across the wavefront of the light beam.

10. The steered high-power laser transmitter of claim 8, wherein said mirrors tip, tilt and piston to produce deviations in a wavefront of the light beam.

11. A steered high-power laser transmitter, comprising:
a laser system configured to emit a light beam;
a linear polarizer configured to convert the light beam to linear polarized light;
a first Micro-Electro-Mechanical System (MEMS) Micro-Mirror Array (MMA) including a plurality of mirrors responsive to command signals to tip and tilt in two degrees-of-freedom (2 DOF) to steer the light beam about an optical axis in a fine angular range no greater than $\pm 2°\times\pm 2°$;
a discrete optical amplifier oriented along the optical axis, said amplifier providing substantially uniform gain over the fine angular range to amplify the light beam;
a fixed quarter waveplate that converts the linearly polarized and amplified light beam to a circularly polarized and amplified light beam; and
a stack of switchable polarization gratings (PGs) responsive to command signals to discretely steer the circularly polarized and amplified light beam in a coarse angular range of at least $\pm 10°\times=10°$.

12. The steered high-power laser transmitter of claim 11, wherein the first MEMS MMA includes a plurality of mirrors configured to tip, tilt and piston in 3 DOF to shape the wavefront of the light beam.

13. A steered high-power laser transmitter, comprising:
a laser system configured to emit a light beam;
a first Micro-Electro-Mechanical System (MEMS) Micro-Mirror Array (MMA) including a plurality of mirrors responsive to command signals to tip and tilt in two degrees-of-freedom (2 DOF) to steer the light beam about an optical axis in a fine angular range no greater than $\pm 2°\times\pm 2°$;
a discrete optical amplifier oriented along the optical axis, said amplifier providing substantially uniform gain over the fine angular range to amplify the light beam; and
a second MEMS MMA including a plurality of mirrors responsive to command signals to tip and tilt in two degrees-of-freedom (2 DOF) to discretely steer the light beam in a coarse angular range of at least $\pm 10°\times\pm 10°$.

14. The steered high-power laser transmitter of claim 13, wherein at least one of the first and second MEMS MMA is partitioned into a plurality of segments to form a plurality of light beams from the light beam, each segment including a plurality of mirrors, and responsive to command signals to tip and tilt the mirrors in each segment to independently steer a plurality of different amplified light beams.

15. The steered high-power laser transmitter of claim 13, wherein the mirrors are provided with coatings that reflect light at different wavelengths such that the amplified light beam includes a plurality of different wavelengths.

16. The steered high-power laser transmitter of claim 13, wherein at least one of the first and second MEMS MMA includes a plurality of mirrors configured to tip, tilt and piston in 3 DOF to shape the light beam to perform one or more of the following:
focus or collimate the light beam;
adjust a size, divergence or intensity profile of the light beam;
produce deviations in a wavefront of the light beam to compensate for atmospheric distortion; and
adjust a phase and maintain a zero phase difference across the wavefront of the light beam.

17. The steered high-power laser transmitter of claim 13, wherein at least one of the first and second MEMS MMA includes a plurality of mirrors configured to tip, tilt and piston in 3 DOF to shape the wavefront of the light beam.

\* \* \* \* \*

UNITED STATES PATENT AND TRADEMARK OFFICE
CERTIFICATE OF CORRECTION

PATENT NO. : 12,360,358 B2  
APPLICATION NO. : 17/238147  
DATED : July 15, 2025  
INVENTOR(S) : Gleason et al.

Page 1 of 1

It is certified that error appears in the above-identified patent and that said Letters Patent is hereby corrected as shown below:

In the Specification

In Column 6, Line 28, delete "-15°×+150" and insert -- -15°×+15°-- therefor

In Column 8, Line 55, delete "10." and insert --1°.-- therefor

In Column 8, Line 60, delete "+8°" and insert --±8°-- therefor

In Column 9, Line 18, delete "2.0°," and insert --±2.0°,-- therefor

In the Claims

In Column 12, Line 10, in Claim 11, delete "±10°×=10°." and insert --±10°×±10°.-- therefor Signed and Sealed this  
Twenty-seventh Day of January, 2026

John A. Squires  
*Director of the United States Patent and Trademark Office*